United States Patent [19]

Raver et al.

[11] 4,221,982
[45] Sep. 9, 1980

[54] LIQUID COOLED RECTIFIED-ALTERNATING CURRENT GENERATOR

[75] Inventors: Louis J. Raver, Anderson; Gene D. Bricker, Wilkinson, both of Ind.

[73] Assignee: General Motors Corporation, Detroit, Mich.

[21] Appl. No.: 929,657

[22] Filed: Jul. 31, 1978

[51] Int. Cl.² .......................................... H02K 9/00
[52] U.S. Cl. ...................................... 310/59; 310/54; 310/68 D
[58] Field of Search .................. 310/68 R, 87, 68 D, 310/52, 58, 54, 59, 53, 60, 57, 65, 112, 89, 263, 266; 363/141; 357/82

[56] References Cited

U.S. PATENT DOCUMENTS

| | | | |
|---|---|---|---|
| 3,078,409 | 2/1963 | Bertsche | 310/68 D |
| 3,226,581 | 12/1965 | Brewster | 310/59 |
| 3,239,701 | 3/1966 | Campbell | 310/54 |
| 3,629,627 | 12/1971 | Dafler | 310/68 D |
| 3,863,127 | 1/1975 | Rauer | 310/68 D |

Primary Examiner—R. Skudy
Attorney, Agent, or Firm—C. R. Meland

[57] ABSTRACT

A liquid cooled rectified-alternating current generator for supplying direct current to electrical loads such as the battery and other electrical loads on a motor vehicle. The generator has a generator compartment containing a stator winding and a rotor. A rectifier compartment is provided at the end of the generator which contains diode rectifiers supported by heat sinks and connected to the stator winding of the generator. A liquid coolant medium, such as engine lubricating oil, is circulated through the generator. The coolant is supplied under pressure to the rectifier compartment, thence to the generator compartment and from there coolant is exhausted into a suitable oil sump. The passage means for supplying coolant from the rectifier compartment to the generator compartment comprises a laterally extending passage having an inlet located adjacent the heat sinks for the rectifiers. The length and position of the passage is such that in any rotative position of the generator sufficient oil is maintained in the rectifier compartment to contact at least one of the heat sinks for the rectifiers. Thus, when the fluid pressure system is shut down the rectifier compartment will retain a certain amount of coolant so that subsequent operation of the generator will not cause destruction of the rectifiers due to overheating.

4 Claims, 7 Drawing Figures

LIQUID COOLED RECTIFIED-ALTERNATING CURRENT GENERATOR

This invention relates to liquid cooled dynamoelectric machines and more particularly to an oil cooled diode-rectified alternating current generator suitable for use as the battery charging generator in a motor vehicle electrical system.

Diode-rectified alternating current generators can be of the air cooled type in which a fan draws air through the generator or can be arranged to be oil cooled in which case engine lubricating oil is circulated through the generator. The advantage of oil cooling is that the generator is completely sealed to obtain a machine that is generally not affected by environmental effects such as salt spray, dust, water and chaff in the case of certain farm machinery. In addition, the air cooled generator is normally disposed close to the engine so that the temperature of the generator is related to ambient air temperature and engine temperature both of which vary. With an oil cooled generator the temperature of the engine oil is nearly constant, when the engine reaches operating temperature, so that the generator is subjected to constant temperatures which are more predictable than air cooled generators.

One type of oil cooled diode-rectified alternating current generator, which has rectifier and generator compartments, is disclosed in the U.S. Pat. No. to Bertsche, Jr. et al., 3,078,409.

When an oil cooled generator of the hinge mounted type is mounted in the engine compartment of a motor vehicle the optimum rotative position of the generator may vary from vehicle to vehicle depending on the best piping arrangement for feeding oil to and exhausting oil from the generator and the best arrangement for connecting the generator pulley to the drive pulley of the engine. Thus, one engine installation will require that the generator be positioned in a certain position while another installation may require that the generator be rotated from that position in order to be best accommodated in the vehicle installation. With oil cooled generators, that have a rectifier compartment connected to the generator compartment, the oil in the compartment that encloses the rectifiers and the heat sinks for the rectifiers may be completely drained therefrom if the generator is in such a position that the passage connecting the rectifier compartment and the generator compartment is lowermost in the installation when the system is shutdown. If this results in oil being drained out of contact with the heat sinks that support the diode rectifiers the subsequent energization of the system will cause the rectifiers and heat sinks to be rapidly elevated in temperature since they are now out of contact with the cooling medium.

It accordingly is one of the objects of this invention to provide a liquid cooled rectified alternating current generator wherein liquid coolant located in the rectifier compartment that houses the rectifiers, and their heat sinks, is maintained in contact with at least a part of heat sinks for the rectifiers regardless of the rotative position of the generator.

In carrying this object forward the generator rectifiers and their heat sinks are located adjacent one end of the rectifier compartment and passage means is provided connecting the rectifier compartment to the generator compartment. This passage means has a laterally extending portion having an inlet located adjacent the rectifier heat sinks and an outlet located near the other end of the rectifier compartment. With this arrangement the laterally extending passage will always maintain a level of coolant within the rectifier compartment which is sufficient to contact at least some portions of the heat sinks for the diode rectifiers regardless of the rotative position of the generator.

Another object of this invention is to provide a diode-rectified oil cooled alternating current generator wherein the laterally extending passage that connects the area adjacent the rectifiers and their heat sinks to the inlet to the generator compartment is comprised of a pair of ribs formed on the end frame of the generator.

IN THE DRAWINGS

Figure 1:
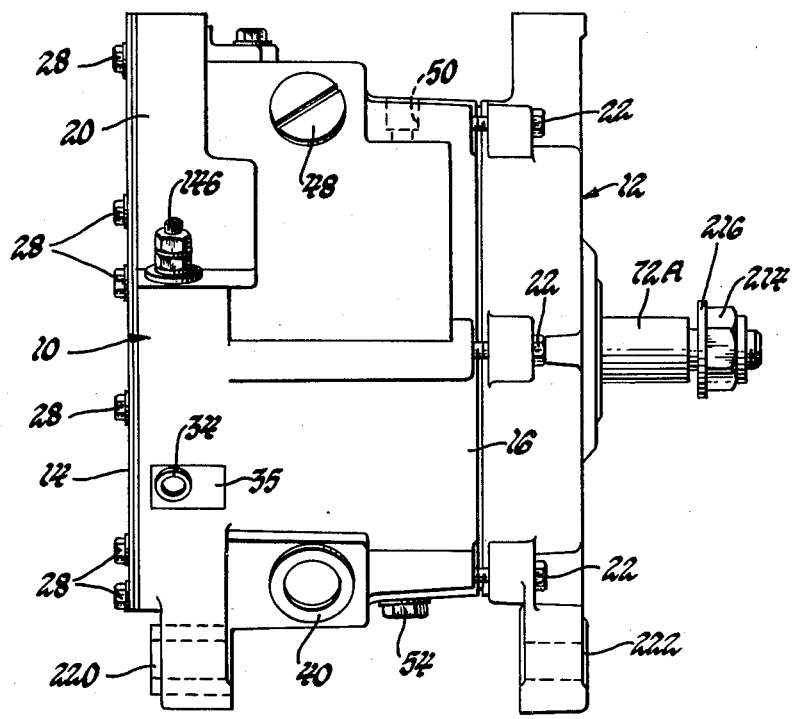
FIG. 1 is a side view of the generator made in accordance with this invention.
Figure 2:
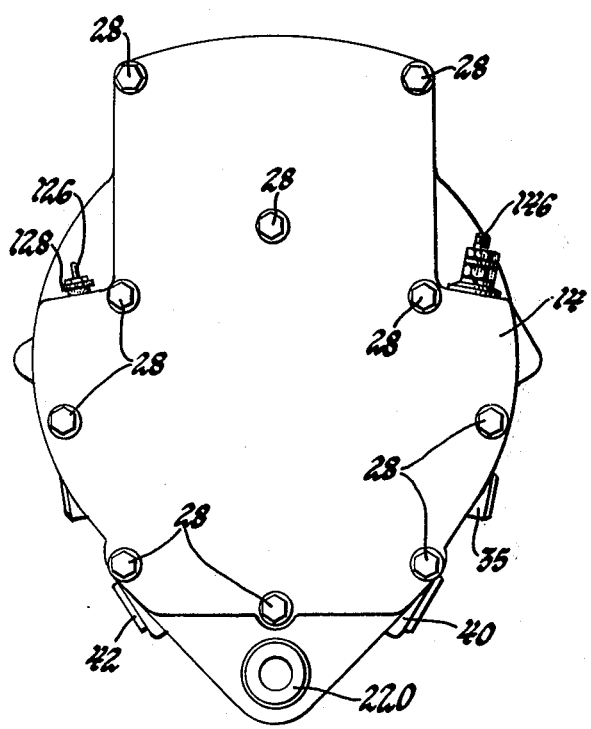
FIG. 2 is an end view of the generator shown in FIG. 1.

Referring now to the drawings, the liquid cooled generator of this invention comprises die cast aluminum frames 10 and 12. An end plate 14 is secured to one end of the frame 10 and, as will be more fully described hereinafter, provides a closure for a liquid tight rectifier compartment that houses the diode rectifiers and their heat sinks.

The frame 10 has a tubular housing portion 16 extending axially in one direction from central wall 18 (FIG. 5) and another housing portion 20 extending in an opposite direction therefrom. Frames 10 and 12 are secured together by bolts 22 which are threaded into threaded openings in housing portion 16. An O-ring 24 is fitted to frame 12 and engages the end of housing portion 16. The housing portion 16 and frame 12 define a liquid tight generator compartment 26.

The end plate 14 is fixed to the end of housing portion 20 by fasteners 28 threaded into frame 10. A gasket 30 is compressed between the end plate 14 and the end of housing 20 to form a liquid tight rectifier compartment 32.

The generator has two inlet openings, one of which is selected during installation of the generator on a vehicle engine to feed liquid coolant, such as engine oil, to the interior of rectifier compartment 32. One inlet opening is designated 34 in FIG. 4 and is formed in boss 35. Opening 34 is pipe threaded to receive a plug or to be connected to an inlet pipe. The threaded opening communicates with an orifice or opening 36 having a diameter of approximately 1.70 to 1.80 millimeters. The opening 36 provides an orifice which restricts the flow of inlet coolant and provides for coolant velocity over the rectifier diodes and their heat sinks in a manner to be more fully described.

The other oil inlet to the generator is formed in housing boss 38. As will be further described one of the inlets is closed by a plug and the other connected to an inlet pipe when the generator is mounted to an engine.

Figure 3:
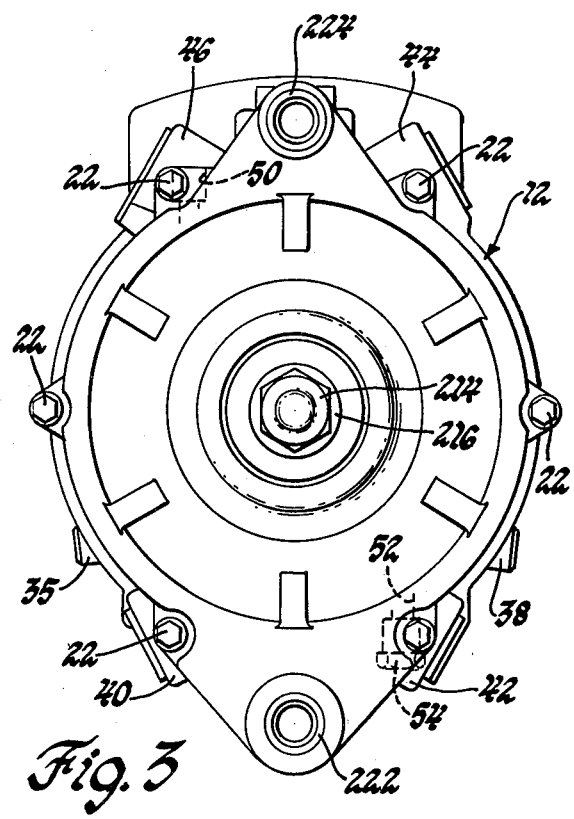
FIG. 3 is an opposite end view of the generator shown in FIG. 1.

The generator has four oil drain openings, three of which are plugged during use and one of which is connected to a drain pipe. One of these openings is designated as 40 in FIG. 1 and another as 42 in FIG. 5. The other two openings are formed in bosses 44 and 46 shown in FIG. 3. The openings all extend through housing portion 16 so as to form an oil outlet for generator compartment 26. One of the plugs for plugging an opening is designated 48 and shown in FIG. 1.

In addition to the two oil inlet openings and the four oil outlet openings, the generator is provided with two vent openings one of which is plugged and the other of which is connected to a vent line or pipe that in turn is connected to some point on the engine that is at atmospheric pressure or higher during use of the generator. Both vent openings extend through housing 16. These vent openings are shown in dotted lines in FIG. 3 and designated 50 and 52. A plug 54 is shown in FIG. 1 closing the vent opening 52 and vent opening 50 is also shown in dotted lines in FIG. 1.

The frame 10 is provided with a wall 56 which engages gasket 30. The gasket 30 also engages end wall 58 to form a sealed voltage regulator compartment 60. Liquid coolant is not supplied to the compartment 60 since it is separated from rectifier compartment 32 by wall 56.

The alternating current generator is of the brushless type and includes a stator core 62 supported by housing 16 and frame 12. The core is formed of magnetic material which carries a three-phase delta-connected stator winding 64. The rotor of the generator comprises pole members 66 and 68 formed of magnetic material having interleaved teeth which may be generally of the type disclosed in the U.S. Pat. No. to Raver 3,863,127. The rotor further includes a cylindrical core member 70 formed of magnetic material which is rotatable with the shaft 72.

The alternating current generator has a fixed field winding 74. The field winding is wound on a spool portion 76 of a field core 77 which is formed of magnetic material. The core portion 77 is secured to the wall 18 of the frame 10 by screws 78 that are threaded into core 77. As will be evident to those skilled in the art, when shaft 72 is rotated the poles 66 and 68 and the core 70 are rotated therewith with the result that an alternating voltage is induced in stator winding 64 having a magnitude which depends upon rotor speed and the amount of direct current supplied to field winding 74.

The rotor shaft 72 is supported for rotation in roller bearing 82 and ball bearing 84 respectively supported by frames 10 and 12. An O-ring seal 86 and an oil seal 88 are provided for preventing loss of coolant supplied to the bearing 84 from the generator compartment 26.

The rectifier compartment 32 contains two heat sinks 90 and 92 formed, for example, of aluminum material each of which supports three silicon diodes. The heat sink 90 supports the three diodes 94 which are press fitted into openings located in the heat sink. The heat sink 92 likewise carries three diodes 96 which are press fitted into the openings formed in the heat sink 92. The heat sinks 90 and 92, as shown schematically in FIG. 6, form the positive and negative direct current output terminals of a three phase full wave bridge rectifier network. Thus, the three conductor leads 98 connected with the three phase winding 64 pass through a grommet 100 located in an opening formed in a part of frame 10 that separates the rectifier and generator compartments. The grommet is formed of a resilient insulating material and provides a fluid tight connection between the generator compartment and the rectifier compartment. These three conductors 98 are respectively connected to terminal studs 102, 104 and 106.

The terminal studs 102 and 104 are supported by heat sink 90 which also supports the terminal stud 108. The heat sink 92 supports terminal stud 106 and also supports terminal studs 110 and 112. All of the terminal studs are electrically insulated from the respective heat sinks and one of the terminal studs 108 is shown in the sectional view of FIG. 5. As can be seen the terminal stud 108 is press fitted to the interior of an insulator 114 which supports and electrically insulates the terminal stud 108 from the heat sink 90. The terminal stud 108 has a threaded end (not illustrated) which receives nuts 116 for retaining apertured electrical connector terminals thereon. The other terminal studs are supported in the same manner as terminal stud 108, that is, they are electrically insulated from their respective heat sinks and each stud has a threaded portion adapted to receive the opening of a connector terminal and nuts for holding the terminal to the terminal studs.

Figure 4:
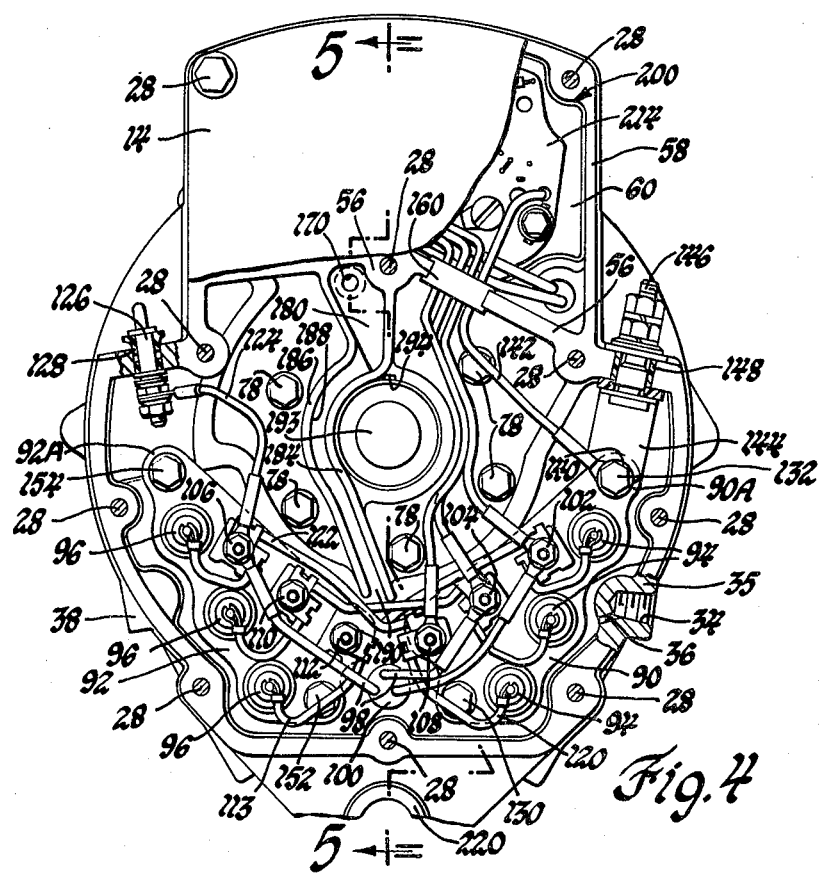
FIG. 4 is a view of an end of the generator with the end plate broken away.
Figure 6:
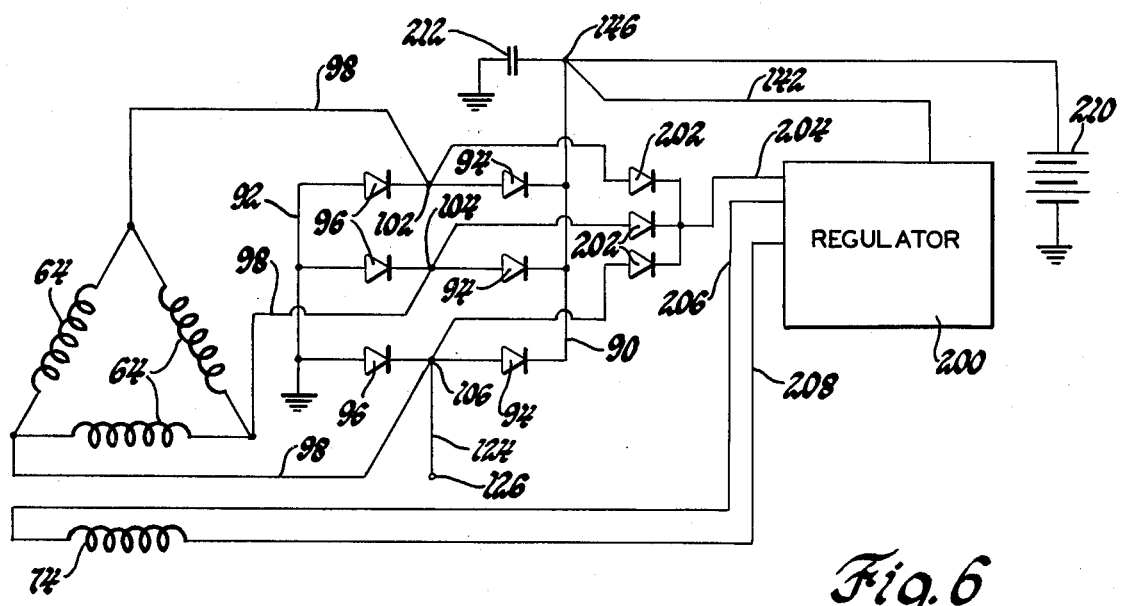
FIG. 6 is a schematic circuit diagram of the electrical system of the generator of this invention.

It will be evident from the wiring shown in FIG. 4 that the arrangement of terminal studs and diodes provides the three-phase full wave bridge rectifier network shown in FIG. 6. Thus, terminal studs 106, 110 and 112 are respectively connected by wires, one of which is identified 113, to the cathodes of diodes 96. Further, the terminal studs 102, 104 and 108 are respectively connected to the anodes of diodes 94 and one of these conductors is identified by reference numeral 120. A conductor 122 connects studs 106 and 108 and a conductor 124 connects stud 106 to a terminal 126 supported by frame 10. The stud terminal 126 is insulated from the frame by insulation 128 which provides a fluid tight support for stud 126.

The heat sink 90 is secured to the frame 10 by screws 130 and 132 that pass through openings in the heat sink. One of the screws 130 is shown in the sectional view of FIG. 5. This screw is threaded into a boss 134 integral with frame 10. The heat sink and screw are both electrically insulated from frame 10 by insulators 136 and 138.

The other screw 132 is threaded into an opening formed in the end frame 10. This screw passes through a terminal connector 140 connected to conductor 142, passes through an opening in one end of connector plate 144 and then through an opening in heat sink 90. The connector plate 144 is electrically connected to a direct voltage output terminal stud 146 which serves as the positive direct current output terminal for the generator. The terminal stud 146 is electrically insulated from the frame of the generator and is also provided with insulation 148 which serves to form a liquid tight connection for the terminal stud 146. The screw 132, connector plate 144 and heat sink 90 are all electrically insulated from the frame 10 by suitable insulator washers and bushings which have not been illustrated. The screw 132 passes through another axially extending boss portion which has not been illustrated but, which like boss portion 134, serves to space the heat sink 90 from an internal wall 150 of the frame 10.

The heat sink 92 is secured to the frame 10 by screws 152 and 154, the heads of which are illustrated in FIG. 4. These screws pass through openings in the heat sink 92 and through suitable bosses like boss 134 to space the heat sink 92 from the wall 150. The heat sink 92 is therefore mounted so that it is in alignment with the heat sink 90 as the heat sinks would be viewed in FIG. 5. The heat sink 92 need not be electrically insulated from the frame 10 when a negative ground system is utilized as is illustrated in FIG. 6.

The conductor 142 passes through a part 160 fitted to a slot formed in wall 56 and this part serves to provide a support for other conductors connected between the regulator compartment 60 and the rectifier compartment 32. When the end plate 14 is secured to the frame 10 a liquid tight connection is provided by part 160 so as to prevent any leakage between the rectifier compartment and the regulator compartment. The part 160 may be formed of a suitable resilient insulating material.

The wall 18 of the frame 10 has a passage 170 that is aligned with a passage 172 formed in an insert 174. The passage 172 is aligned with a passage 176 formed in field core 77. The insert 174 is tightly clamped between frame wall 18 and field core 77 when the field core is secured to the frame. Thus, the passages 170, 172 ans 176 form, in effect, a single passage connecting an area or chamber 180 to point 182 located adjacent one end of field coil 74.

The area or chamber 180 is formed in part by wall 56 and a part of two walls or ribs 184 and 186 that extend axially toward plate 14 from wall 18. The ribs 184 and 186 are formed when the frame 10 is cast and are therefore integral with wall 18. When the end plate 14 and gasket 30 are secured to frame 10 the gasket engages the ends of walls 56, 184 and 186 to form chamber 180 and a passage 188 having an inlet 190. The inlet 190 is formed at a point where walls 184 and 186 terminate. The passage 188 supplies cooling oil to chamber 180 and therefore supplies the inlet side of passage 170.

It is important to note that the inlet 190 of the passage 186 is located closely adjacent the inner ends of heat sinks 90 and 92 and at a point that is below the top ends 90A and 92A of the heat sinks 90 and 92. The term "top end" as just referred to is used in conjunction with the position of the generator shown in FIG. 4. Thus, it is assumed that the generator is mounted on the engine in FIG. 4 in such a position that the inlet 190 is lowermost.

If it is assumed now that the generator is mounted in the position rotated 180° from its position shown in FIG. 4 the inlet 190 of passage 188 will be reversed from its position shown in FIG. 4, or in other words would be uppermost in regard to fluid level contained in rectifier compartment 32. Assuming this position for the generator it will be appreciated that during a shutdown condition of the generator where engine oil is not being supplied thereto, oil can drain by gravity through passages 188, 170, 172 and 176 into the generator compartment 26. The level of oil, however, can never drop below the level of inlet 190 so that it will be apparent that even during a shutdown condition of the generator some oil will be retained in compartment 32 and in contact with at least portions of one or both heat sinks 90 and 92 at the oil level maintained in the compartment 32 by the position of the inlet 190 relative to the heat sinks.

Figure 5:
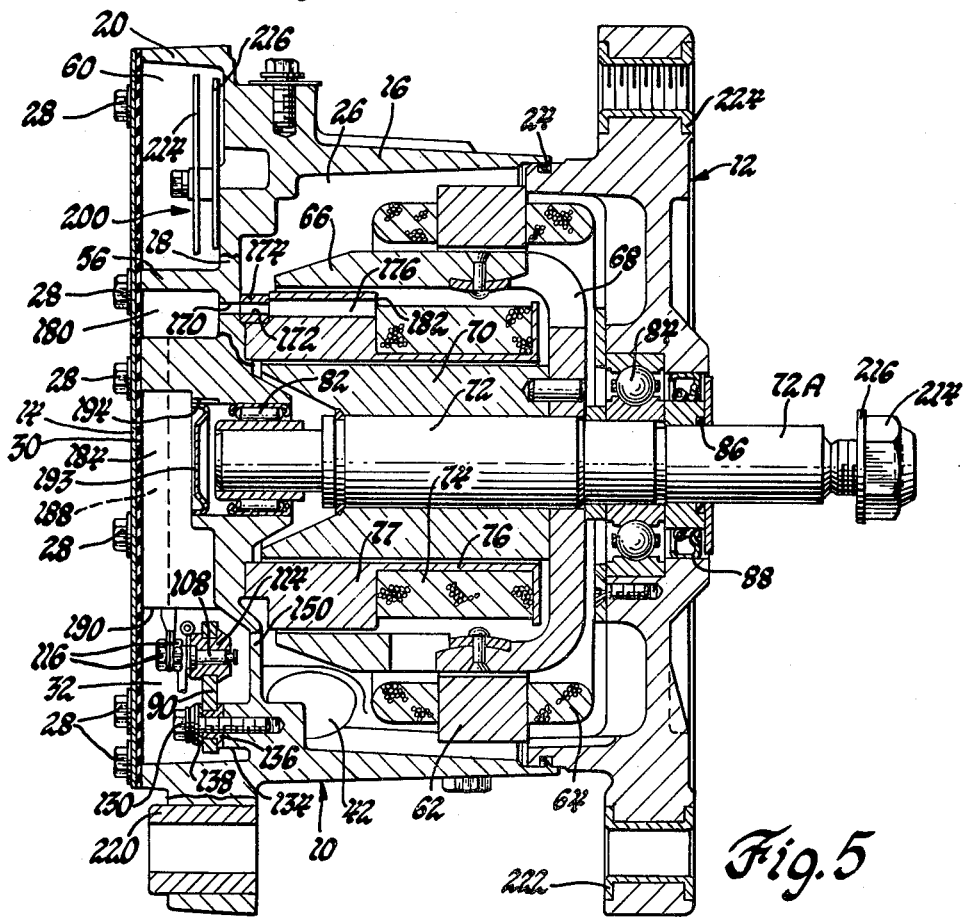
FIG. 5 is a sectional view of the generator taken along lines 5—5 of FIG. 4.

The bearing 82 is lubricated by engine oil passing from rectifier compartment 32 to generator compartment 26. The outer end of the bearing 82 is closed by a plug 193. However, a groove 194 is provided which bypasses the plug 193 and provides bleed lubrication for bearing 82. The groove 194, as shown in FIGS. 4 and 5, is formed in the frame 10. This groove is small and may have a depth of approximately 2 millimeters and a width of about 2.5 millimeters. When the system is under pressure the groove 194 permits a small amount of oil to be fed through the bearing 82 from rectifier compartment 32 to generator compartment 26. The opening 194 is so small that it has little or no drain effect on compartment 32 when the system is shutdown.

The voltage regulator compartment 60 contains a transistor voltage regulator generally designated by reference numeral 200. The regulator is illustrated as a block in FIG. 6 and can take various well known forms. The voltage regulator circuit, for example, may be of the type disclosed in the above-mentioned Raver U.S. Pat. No. 3,863,127.

The generator field current is supplied by three diodes 202 in a manner well known to those skilled in the art. The energization circuit for the field 74 includes conductor 204, conductor 206, conductor 208 and a control transistor (not illustrated) connected between conductor 208 and ground. The voltage sensed by the voltage regulator is supplied to the regulator via conductor 142 which is connected to junction 146. The battery of the system is designated by reference numeral 210 and is connected between direct voltage output terminal 146 and ground. As is well known to those skilled in the art the purpose of the regulator is to maintain a predetermined regulated battery charging voltage between junction 146 and ground. The regulator can take various physical constructions and has not been shown in any great detail. As one example, the regulator 200 may include a circuit board 214 carrying various components of the regulator and a metal plate 216 which may carry the power output transistor of the regulator. The regulator is mounted to the frame of the generator within compartment 60.

In utilizing the oil cooled generator of this invention the user mounts the generator on the engine in such a position that is convenient for connecting various oil lines and for driving the generator by a suitable pulley driven belt. The generator is fitted with a drive pulley which is placed on generator shaft portion 72A and is held in place by nut 214 and washer 216 in a manner well known to those skilled in the art. The generator is of the hinge mounted type and the bushings 220 and 222 are utilized for this purpose. The generator has another threaded bushing 224 for receiving a bolt to secure the generator to an adjusting strap as is known to those skilled in the art. Thus, a bolt passing through bushings 220 and 222 provides the pivot for the generator and the bolt that cooperates with bushing 224 secures the generator to an adjusting strap in the desired rotative position.

The user selects one of the inlet openings of the generator, for example inlet opening 34, which can be most conveniently connected to the engine. The user further selects one of the outlet openings, for example outlet opening 40, as the drain for the installation. Further, the user selects one of the vent openings 50 or 52 to be connected to a point of atmospheric pressure or higher in the installation. The vent opening selected will be the uppermost vent opening of the generator after the generator has been mounted in a desired rotative position. The remainder of the inlet, outlet and vent openings are all plugged by suitable plugs.

Figure 7:
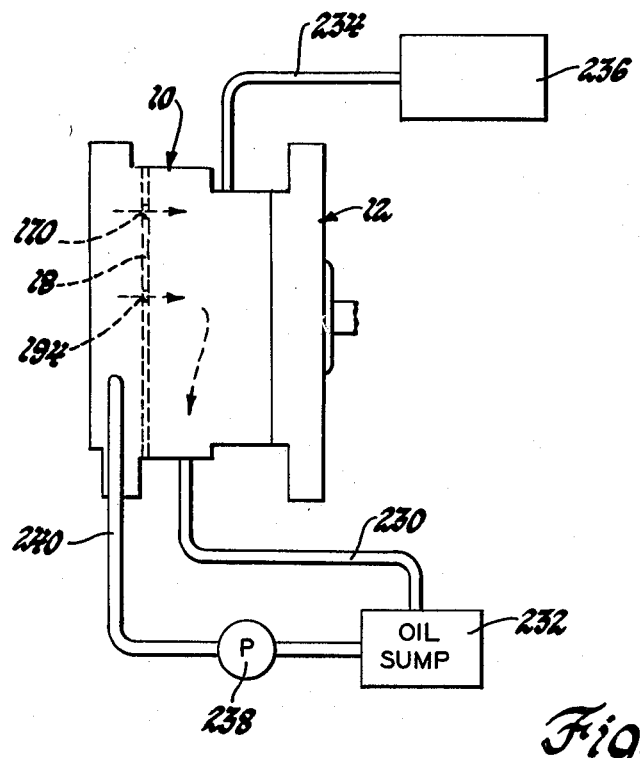
FIG. 7 is a schematic illustration of the oil cooling circuit utilized for supplying cooling oil to the generator of this invention.

Referring now to FIG. 7, a schematic oil circulating diagram for the generator of this invention is illustrated. It is seen that one of the outlet openings of the generator is connected to a pipe 230 which leads to an oil sump 232 which may be, for example, the oil sump of a diesel engine. One of the vent openings (uppermost in the installation) is connected to a pipe 234 which in turn is connected to a point of atmospheric pressure or higher on the engine which has been designated by reference numeral 236.

Engine lubricating oil from the oil sump 232 is supplied to an inlet of a pump 238 which supplies pipe 240. The pipe 240 is intended to indicate the general oil circulating system of a diesel engine and may include an oil filter and an oil cooler, neither of which have been illustrated. After the oil has been cooled and filtered it is supplied to the rectifier compartment 32. The oil is then forced through the passage 170 connecting the rectifier and generator compartments and some of the oil, as previously pointed out, is used to lubricate the bearing 82 via the bleed opening 194. The oil then exits via a drain opening where it is supplied to the pipe 230.

The oil cooling circuit is a parallel circuit to that of the main engine lubricating system and the oil supplied to the rectifier compartment 32 may be taken off a diesel engine oil gallery which is supplied with filtered and cooled oil.

When oil under pressure is supplied from pipe 240 to the rectifier compartment 32 it passes through an orifice, for example the orifice 36 (FIG. 4) and this orifice is aligned with the heat sink 90 such that a high velocity oil spray is applied to the heat sink 90. If the inlet opening in the boss 38 had been utilized as the oil inlet the orifice provided for that inlet of the generator, which has not been illustrated, would provide a high velocity flow of inlet oil against the rectifier heat sink 92. Thus, the orifice formed in boss 38 is aligned with the heat sink 92 in the same manner as the alignment of the orifice 34 with heat sink 90.

The oil is supplied at high velocity to cool heat sinks 90 and 92 and the diodes carried thereby and then passes from the rectifier compartment 32 to the generator compartment 36 via inlet opening 190 of passage 188, passage 188, chamber 180, passage 170, passage 172 and passage 176 to the outer periphery of field coil 74. The outlet side of passage 176 (point 182) is disposed adjacent the outer periphery of the field coil 74 so that coolant is forced across the outer periphery of the coil from the outlet of passage 176. With the generator running the rotor rotates and oil is circulated in contact with the stator winding 64 to cool this winding. Some of the oil lubricates the bearing 84. The oil coolant exits the generator via one of the outlet openings connected with the pipe 230.

A small amount of oil passes between the rectifier compartment 32 and the generator compartment 20 via the small opening 194 and this oil serves to lubricate the bearing 82.

The various inlet and oulet openings for the generator are provided with pipe threads one of which has been identified by reference numeral 34 (FIG. 4) and these are utilized to either accommodate a plug when a particular oil inlet or outlet is not to be utilized or to provide a means for connecting a pipe to the generator.

The venting of the generator compartment to atmosphere or higher pressure prevents, by either vent opening 50 or 52, the forming of a vacuum in the generator which would have the effect of impeding drainage of cooling oil.

The length and position of passage 188 is such that at least some oil will be retained in rectifier compartment 32 in contact with at least a portion of one or both heat sinks 90 and 92 when the generator is in any rotative position where inlet 190 can operate as part of a drain.

During a shut down condition of the generator some coolant may drain through passage 194 from rectifier compartment 32 to generator compartment 26. This passage is positioned with respect to the heat sinks 90 and 92 and ribs 184 and 186 such that at least some coolant is retained in contact with a heat sink regardless of rotative position of the generator. In this regard it is noted that the ribs 184 and 186 form a wall or dam separating upper left and right portions of rectifier compartment 32 when the generator is in the FIG. 4 position. Thus, even if the generator were rotated 180° from its FIG. 4 position, and assuming drainage through passage 194, some coolant would still be retained in contact with heat sink 92.

Further, the passage 36 connected to passage 34 and the corresponding passages in boss 38 are located such that at least some coolant is retained in contact with a heat sink in the event of drainage through these passages during a shut down condition of the generator.

The embodiments of the invention in which an exclusive property or privilege is claimed are defined as follows:

1. A liquid cooled rectified-alternating current generator comprising, housing means defining a generator compartment, a stator winding disposed within said generator compartment, means including rotor means rotatable with respect to said stator winding for causing an alternating current to be generated in said stator winding when said rotor means is rotated, housing means defining a rectifier compartment disposed adjacent said generator compartment and separated therefrom by a laterally extending wall common to said compartments, means defining an inlet passage adapted to be connected to a source of pressurized liquid cooling medium for supplying liquid cooling medium to said rectifier compartment, first passage means extending through said laterally extending wall for connecting said rectifier compartment and said generator compartment, rectifier means disposed within said rectifier compartment comprising at least one heat sink means supporting a rectifier means, said rectifier means electrically connected to said stator winding, said heat sink means being spaced from said first passage means, means defining second laterally extending passage means having an inlet located adjacent said heat sink means connecting said inlet to said first passage means, the length of said second passage means being such that liquid cooling medium in said rectifier compartment is maintained at a level at which it contacts at least a portion of said heat sink means when said rectifier compartment is positioned such that the inlet of said second passage means can operate as a drain for liquid cooling medium contained in said rectifier compartment when said rectifier compartment is not being fed with pressurized liquid cooling medium, and means defining an outlet passage connected to said generator compartment for exhausting cooling medium therefrom.

2. A liquid cooled rectified-alternating current generator comprising, housing means defining a generator compartment, rotor means and stator means located in said generator compartment for causing an alternating current to be generated in said stator means, housing means defining a rectifier compartment disposed adjacent said generator compartment, means defining an inlet passage adapted to be connected to a source of pressurized liquid cooling medium for supplying liquid cooling medium to said rectifier compartment, first passage means disposed adjacent one side of said rectifier compartment connecting said rectifier and generator compartments, a plurality of heat sinks each carrying at least one diode disposed adjacent an opposite side of said rectifier compartment, means connecting said diodes to said stator means, second laterally extending passage means having an inlet disposed adjacent said heat sinks and an outlet connected to said first passage means, the length and position of said second passage means being such that liquid cooling medium in said rectifier compartment is maintained at a level at which it contacts at least one of said heat sinks when said rectifier compartment is positioned such that the inlet of said second passage means can operate as a drain for liquid cooling medium contained in said rectifier compartment when said rectifier compartment is not being fed with pressurized liquid cooling medium, and means defining an outlet passage connected to said generator compartment for exhausting cooling medium therefrom.

3. A liquid cooled rectified alternating current generator comprising, housing means defining a generator compartment, rotor means and stator means located in said generator compartment for causing an alternating current to be generated in said stator means, housing means defining a rectifier compartment disposed adjacent said generator compartment, an inlet passage connected to said rectifier compartment, an outlet passage connected to said generator compartment, said inlet and outlet passages being adapted to be connected to a pressurized source of liquid cooling medium for circulating cooling medium through said rectifier and generator compartments, first passage means disposed adjacent one side of said rectifier compartment connecting said rectifier and generator compartments, a pair of heat sinks disposed adjacent an opposite side of said rectifier compartment, diodes electrically connected to said stator means supported by said heat sinks, and second laterally extending passage means having an inlet disposed between portions of said heat sinks and an outlet connected to said first passage means, the length and position of said second passage means being such that liquid cooling medium in said rectifier compartment is maintained at a level at which it contacts at least one of said heat sinks when said rectifier compartment is positioned such that the inlet of said second passage means can operate as a drain for liquid cooling medium contained in said rectifier compartment when said rectifier compartment is not being fed with pressurized liquid cooling medium.

4. A liquid cooled rectified alternating current generator comprising, a frame having a laterally extending wall, said frame having first and second portions extending axially in opposite directions from said laterally extending wall, means including said first frame portion defining a generator compartment, outlet passage means connected to said generator compartment for exhausting liquid cooling medium therefrom, rotor means and stator means located in said generator compartment for causing an alternating current to be generated in said stator means, end plate means secured to an end of said second frame portion to define a rectifier compartment therewith, means defining an inlet passage adapted to be connected to a source of pressurized cooling medium for supplying liquid cooling medium to said rectifier compartment, first passage means extending through said laterally extending wall and disposed adjacent one side of said rectifier compartment for connecting said rectifier and generator compartments, a plurality of heat sinks each carrying at least one diode located adjacent an opposite side of said rectifier compartment, means connecting said diodes to said stator means, second laterally extending passage means having an inlet located adjacent said heat sinks and an outlet connected to said first passage means, said second passage means being formed by a pair of spaced ribs that are integral with said laterally extending wall and said end plate means, the end plate means serving to close the open end of a channel formed by said spaced ribs, the length and position of said second passage means being such that liquid cooling medium in said rectifier compartment is maintained at a level at which it contacts at least one of said heat sinks when said rectifier compartment is positioned such that the inlet of said second passage means can operate as a drain for liquid cooling medium contained in said rectifier compartment when said rectifier compartment is not being fed with pressurized cooling medium.

* * * * *